US008130046B2

(12) United States Patent
Kwok

(10) Patent No.: US 8,130,046 B2
(45) Date of Patent: Mar. 6, 2012

(54) FREQUENCY CALIBRATION OF RADIO FREQUENCY OSCILLATORS

(75) Inventor: Sai C. Kwok, Escondido, CA (US)

(73) Assignee: Qualcomm Incorporated, San Diego, CA (US)

( * ) Notice: Subject to any disclaimer, the term of this patent is extended or adjusted under 35 U.S.C. 154(b) by 78 days.

(21) Appl. No.: 12/407,666

(22) Filed: Mar. 19, 2009

(65) Prior Publication Data

US 2010/0237951 A1 Sep. 23, 2010

(51) Int. Cl.
*H03L 7/00* (2006.01)
(52) U.S. Cl. ............... 331/16; 331/1 A; 331/117 R
(58) Field of Classification Search ........... 331/1 A, 331/16, 117 R
See application file for complete search history.

(56) References Cited

U.S. PATENT DOCUMENTS

| 6,853,261 | B1 | 2/2005 | Ling |
| 7,019,595 | B1 * | 3/2006 | Lo et al. ............ 331/16 |
| 7,295,078 | B2 | 11/2007 | Coppola et al. |
| 7,312,664 | B2 | 12/2007 | Loke et al. |
| 7,323,944 | B2 | 1/2008 | Florescu et al. |
| 7,443,252 | B2 * | 10/2008 | Tu et al. ............ 331/44 |
| 2002/0033741 | A1 * | 3/2002 | Craninckx et al. ....... 331/117 R |
| 2003/0224747 | A1 * | 12/2003 | Anand ............. 455/208 |
| 2004/0160277 | A1 * | 8/2004 | Cerisola ............ 330/260 |
| 2006/0055468 | A1 | 3/2006 | Hallivuori et al. |
| 2008/0002801 | A1 | 1/2008 | Droege et al. |
| 2008/0129402 | A1 * | 6/2008 | Han et al. ........... 331/179 |
| 2010/0102888 | A1 * | 4/2010 | Edwards et al. ....... 331/16 |

FOREIGN PATENT DOCUMENTS

WO WO0067325 A1 11/2000

OTHER PUBLICATIONS

International Search Report and Written Opinion—PCT/US2010/027864, International Search Authority—European Patent Office—Jun. 18, 2010.

* cited by examiner

*Primary Examiner* — Joseph Chang
*Assistant Examiner* — Jeffrey Shin
(74) *Attorney, Agent, or Firm* — Eric Ho

(57) ABSTRACT

A wireless communication device incorporating a set of comparators and logic interrupt into the local oscillator generation circuit block is described. In one design, the local oscillator circuit block includes a RF VCO with coarse and fine frequency tuning. The RF VCO fine frequency tuning signal is monitored continuously to determine if the control voltage is within specified limits. If the RF VCO fine frequency tuning voltage is too low or too high for the RF VCO to meet system requirements or lock on the current desired frequency, an interrupt signal is asserted. In response to the interrupt signal, a wireless communications processor or a hardware state machine initiates coarse frequency calibration of the RF VCO at the desired frequency. After coarse frequency calibration has completed, the RF VCO fine frequency tuning voltage is within specified limits and is continuously monitored.

4 Claims, 13 Drawing Sheets

FREQUENCY CALIBRATION OF RADIO FREQUENCY OSCILLATORS

TECHNICAL FIELD

The present disclosure relates generally to integrated circuits, and more specifically to frequency calibration of radio frequency (RF) oscillators in the event of operating temperature or voltage drift.

BACKGROUND

Wireless communication devices with radio frequency (RF) integrated circuits (RFICs) may incorporate radio frequency voltage-controlled oscillators (RF VCOs) which are used as local oscillators to convert baseband communication channels to and from one of many RF channels.

RF channel tuning is accomplished by phase-frequency locking a RF VCO output frequency signal with a reference frequency, typically derived from a reference oscillator, in conjunction with a RF phase-locked loop (RF PLL). In wireless communication devices, the RF PLL is usually part of the same RFIC as the RF VCO. The RF PLL compares the RF VCO output frequency (utilizing a frequency divider) with the reference frequency. The RF PLL output provides a correction signal derived from the phase-frequency difference between the reference frequency and the frequency divided RF VCO output frequency.

The correction signal is, in turn, filtered (using a loop filter) to produce an analog control voltage for input to the RF VCO, and serves as a fine frequency tuning signal. When the RF VCO is not in phase or frequency lock with the reference frequency, the fine frequency tuning signal (the filtered correction signal) converges to a value (either increases or decreases in voltage) until the RF VCO output frequency is phase and frequency locked to the reference frequency. If the RF VCO cannot maintain phase and frequency lock, the wireless communication link performance, as measured at the RF channel, will not function properly or not at all.

Wireless communication devices operating across multiple radio frequency bands benefit from a RF VCO having wide frequency tuning range. Wide frequency tuning range is achieved with multiple tuning elements (comprised of fine and coarse tuning elements) in the RF VCO. Fine frequency tuning is provided by the fine tuning elements, while coarse frequency tuning is provided by the coarse tuning elements. During fine frequency tuning, the RF PLL and loop filter provide a fine frequency tuning signal to the fine tuning element within the RF VCO. Coarse frequency tuning is accomplished by switching in or out various discrete coarse tuning elements (setting a coarse frequency tuning code) to shift the RF VCO output frequency in large steps.

Unfortunately, the fine and coarse tuning element component values vary significantly with changes in operating temperature and operating voltage, leading to frequency drift in the RF VCO for a given fine frequency tuning signal voltage and coarse frequency tuning code. This frequency drift must be compensated for to ensure that the RFIC, along with RF VCO and RF PLL, properly tunes to the desired RF channel. In extreme cases, the frequency drift may exceed the fine frequency tuning signal voltage capability of the RF PLL and the RF VCO if the coarse frequency tuning code is held constant for a specific RF channel.

Coarse frequency tuning, in combination with fine frequency tuning, also allows the RFIC to better compensate for IC process variations. Coarse frequency tuning may be utilized as a method for reducing IC process variations affecting the RF VCO output frequency vs. coarse frequency tuning code (coarse frequency calibration).

Coarse frequency calibration may be done by frequency locking the RF PLL (with the fine frequency tuning signal) and RF VCO (with both fine frequency tuning signal and coarse frequency tuning code inputs) across multiple operating frequencies at circuit startup to compensate for process variations at a starting operating temperature. The final step of coarse frequency calibration is to store coarse frequency tuning codes across a range of desired RF VCO output frequencies.

Alternatively, coarse frequency calibration may be done only once, usually when the RFIC, including the RF VCO, is installed in a wireless communication device and is ready to be programmed and tested in a factory. In this case, the coarse frequency calibration is completed when the coarse frequency tuning codes are stored during factory testing over a range of desired RF VCO output frequencies at a nominal factory operating temperature. A third method may perform coarse frequency calibration at both circuit startup and in a factory environment.

As mentioned above, coarse frequency calibration may be done on multiple RF channels and/or operating RF bands (cellular, PCS, GPS, UMTS, GSM, etc) and multiple RF VCOs (transmit, receive, GPS, Bluetooth, etc). Coarse frequency tuning codes are generated during calibration and stored in the wireless communication device memory for later use as coarse frequency tuning during operation of the device with particular frequency bands or operating channels.

Conventional fine and coarse frequency tuning calibration techniques suffer in certain circumstances. In one instance, the RF VCO coarse frequency calibration is only performed at the beginning of the wireless communication device operation (on power-up), and at an initial temperature which changes after the coarse frequency calibration is complete.

One of the worst case conditions is to perform fine and coarse frequency tuning calibration at the coldest operating temperature (often below 0 C., freezing) and observe the RF VCO circuit behavior as the wireless communication device temperature rises from self-heating during normal operation. In the event that the coarse frequency tuning code is not changed for a given RF IC operating frequency, the fine frequency tuning signal (or voltage) is observed falling outside operating (voltage) limits. In this situation, the RF PLL will not be able to maintain frequency lock. Alternatively, the phase noise of the RF VCO may be significantly compromised as might occur when the fine frequency tuning signal approaches its operating (voltage) limit for a given coarse frequency tuning code. As explained above, coarse frequency tuning codes are matched to a particular RF operating channel during calibration and kept constant post-calibration. In either scenario, the wireless communication device may fail critical performance tests as it lacks proper calibration.

Given the limitations of RFICs utilizing wide-band RF VCOs with the requirement for coarse frequency tuning codes and fine frequency tuning signals, a more optimal design to deal with RF VCO frequency tuning variations for operating temperature changes is desirable.

SUMMARY

Techniques for correcting frequency tuning variations over operating temperature changes in a device including a RF VCO are provided.

A wireless communication device incorporating a set of comparators and logic interrupt into the local oscillator generation circuit block is described. In one design, the local oscillator circuit block includes a RF VCO with coarse and fine frequency tuning. The RF VCO fine frequency tuning signal is monitored continuously to determine if the control voltage is within specified limits. If the RF VCO fine frequency tuning voltage is too low or too high for the RF VCO to meet system requirements or lock on the current desired frequency, an interrupt signal is asserted. In response to the interrupt signal, a wireless communications processor or a hardware state machine initiates coarse frequency calibration of the RF VCO at the desired frequency. After coarse frequency calibration has completed, the RF VCO fine frequency tuning voltage is within specified limits and is continuously monitored.

In one aspect, a RF VCO frequency is altered by adjusting the capacitance of a RF VCO LC resonator for frequency drift and changing output frequencies. In a further aspect, the capacitor within the LC resonator may be composed of multiple tuning elements in parallel to provide both coarse and fine frequency tuning of the RF VCO. Coarse frequency tuning is necessary to reduce the continuous fine frequency tuning range of the RF VCO and reduce the RF VCO phase noise verses frequency offset from the desired radio frequency. Fine frequency tuning is necessary to tune the RF VCO to the desired radio frequency. The fine frequency tuning signal is an analog voltage for continuous frequency tuning of the RF VCO and has limited voltage tuning range.

In another aspect, the coarse frequency tuning code is digital. There is a control register with multiple bits to select which capacitive (or inductive) elements in the RF VCO LC resonator are enabled or disabled. The switched capacitors (or inductors) may be connected in parallel with the fine frequency tuning element.

In a further aspect, a hardware circuit is added to the RFIC where the fine frequency tuning signal voltage for the RF VCO may be monitored continuously to determine if the fine frequency tuning signal voltage, provided to the RF VCO, is within specified voltage limits. If the fine frequency tuning signal voltage is too low or too high for the RF VCO to meet wireless communication device requirements or lock on the desired radio frequency, an interrupt signal may be asserted to the wireless communication device baseband modem (processor) that programs the radio frequency integrated circuit (RFIC), RF PLL, and coarse tuning control for the RF VCO. The processor or a hardware state machine on the RFIC initiates a coarse frequency calibration of the RF VCO, within the RFIC, to maintain frequency lock and optimal RF VCO phase noise performance.

Various other aspects and embodiments of the disclosure are described in further detail below.

The summary is neither intended nor should it be construed as being representative of the full extent and scope of the present disclosure, which these and additional aspects will become more readily apparent from the detailed description, particularly when taken together with the appended drawings.

DETAILED DESCRIPTION

A wireless communication device described therein may be used for various wireless communication cellular/PCS/IMT band systems such as CDMA, TDMA, FDMA, OFDMA, and SC-FDMA. In addition to cellular, PCS or IMT network standards, this wireless communication device may be used for local-area or personal-area network standards, WLAN, Bluetooth, & UWB. The wireless communication device may also be used for various mobile broadcast systems such as DVB-H, MediaFLO, etc.

Figure 1:
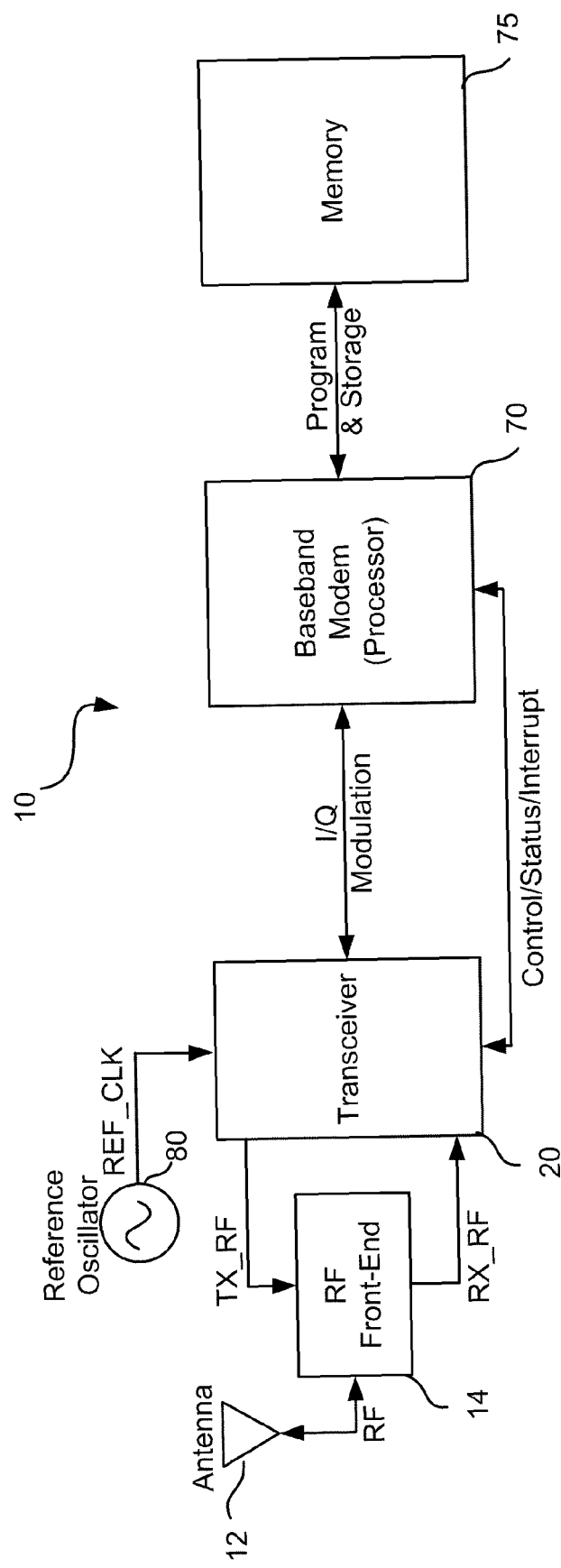
FIG. 1 is a block diagram of a wireless communication device.

FIG. 1 is a block diagram of a wireless communication device 10 in accordance with the present embodiment as shown. Wireless communication device 10 includes radio frequency (RF) antenna 12 connected to RF Front-End 14. RF Front-End 14 separates transmit and receive RF signal paths, and provides amplification and signal distribution. RF signals for transmit, TX_RF, and receive, RX_RF, are passed between transceiver 20 and RF Front-End 14.

Transceiver 20 is configured to down-convert a RX_RF signal from RF to a signal for baseband I/Q demodulation by processor 70, which may be a baseband modem or the like. Transceiver 20 is similarly configured to up-convert a signal from processor 70, using baseband I/Q modulation, to a TX_RF signal. Signals to be up-converted and down-converted from/to baseband I/Q modulation are shown connected between transceiver 20 and processor 70. Transceiver 20 utilizes a reference clock oscillator 80. Reference clock oscillator 80 generates a reference clock frequency signal, REF_CLK, as will be shown in subsequent FIGS. 2 and 3.

Memory 75 stores processor programs and data and may be implemented as a single integrated circuit (IC), as shown.

Processor 70 is configured to demodulate incoming baseband receive I/Q signals, encode and modulates baseband transmit I/Q signals, and run applications from storage, such as memory 75, to process data or send data and commands to enable various circuit blocks, all in a known manner.

In addition, processor 70 generates control signals to transceiver 20 through a data bus, serial bus, or a dedicated set of signals. Such control signals may include, for example, turning transceiver 20 on and off, changing RF channels, and performing or initiating within transceiver 20 RF VCO coarse frequency calibration.

Processor 70 is also configured to read the state of transceiver 20, and at the same time also receive one or more interrupt signals (not shown) from transceiver 20. Interrupt signals are used to initiate commands and algorithms between transceiver 20 and processor 70.

It should be appreciated that the general operation of processor 70, transceiver 20, reference oscillator 80, and memory 75 are well known and understood by those skilled in the art, and that various ways of implementing the associated functions are also well known, including providing or combining functions across fewer integrated circuits (ICs), or even within a single IC.

In one aspect, processor 70 controls the RF VCO frequency (not shown in FIG. 1), depending on one or more conditions of transceiver 20. Transceiver 20 conditions include an operating mode (CDMA, TDMA, FDMA, OFDMA, SC-FDMA, GPS, . . . ), operating frequency band (US cellular, US PCS, IMT, . . . ), and whether the RF VCO requires coarse frequency calibration.

Figure 2:
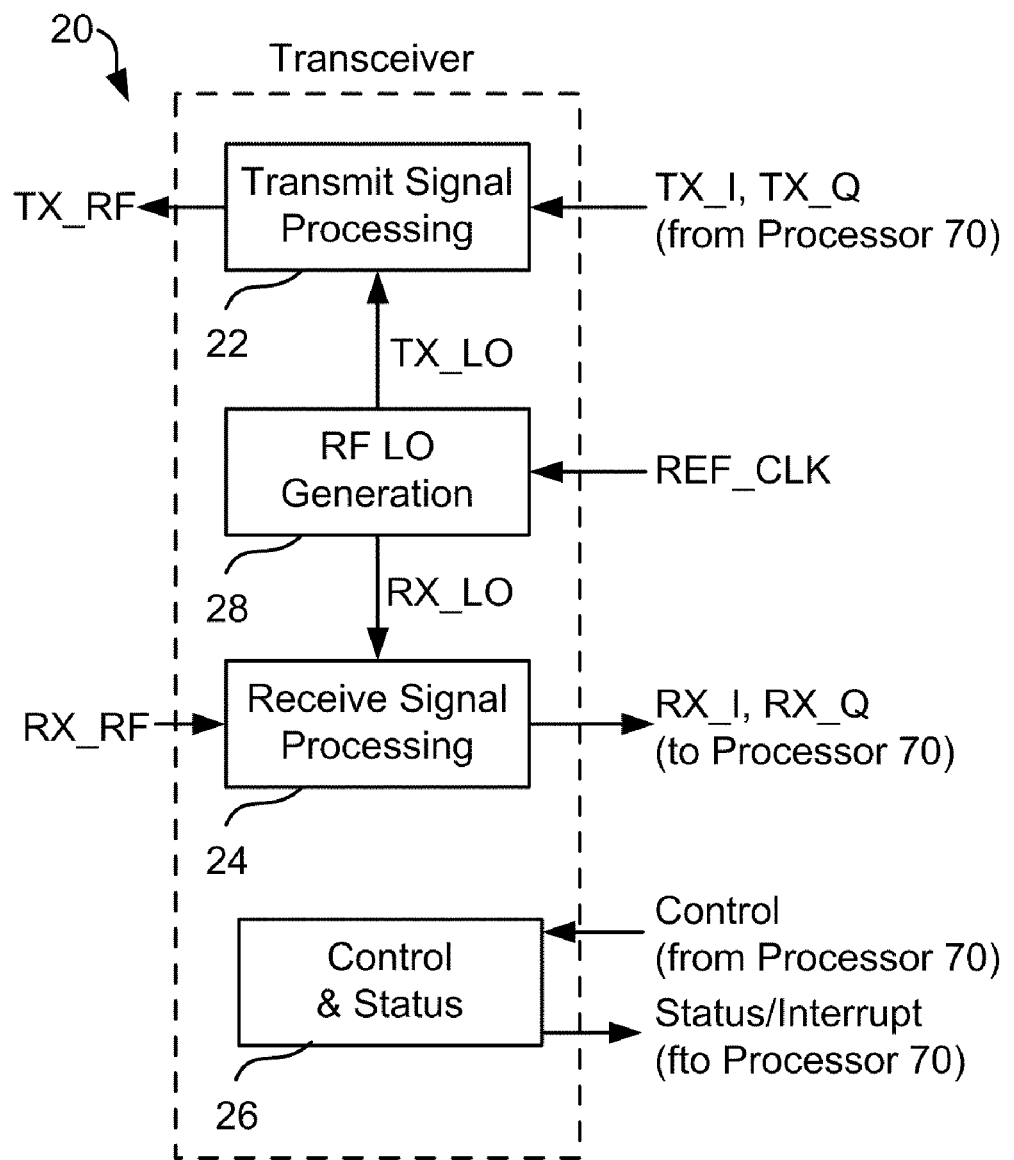
FIG. 2 is a block diagram of a radio frequency integrated circuit (RFIC) transceiver.

FIG. 2 is a block diagram of a radio frequency integrated circuit (RFIC) transceiver (transceiver 20) of FIG. 1 in accordance with the present embodiment as shown. Transceiver 20 includes transmit signal processing block 22, receive signal processing block 24, RF local oscillator (RF LO) generation block 28, and control and status block 26. Control and status block 26 provides digital control logic to/from processor 70 including an interrupt signal for RF VCO coarse frequency calibration. REF_CLK, from reference clock oscillator 80, feeds into RF LO generation block 28.

Transceiver 20, while shown with just one transmit and receive signal processing block, may also exist with any combination of multiple receive blocks, multiple transmit blocks, or any number of possible transmit and receive signal processing block configurations. For example, transmit signal processor block 22 and receive signal processing block 24 are shown as separate functional blocks but may be combined to some extent in a half duplex radio device mode. Similarly, RF LO generation block 28, while logically shown as a separate common block disposed between transmit signal processing block 22 and receive signal processing block 24, other configurations are contemplated. Control and status block 26 can be similarly reconfigured without departing from the scope of the preferred embodiments described herein.

Figure 3:
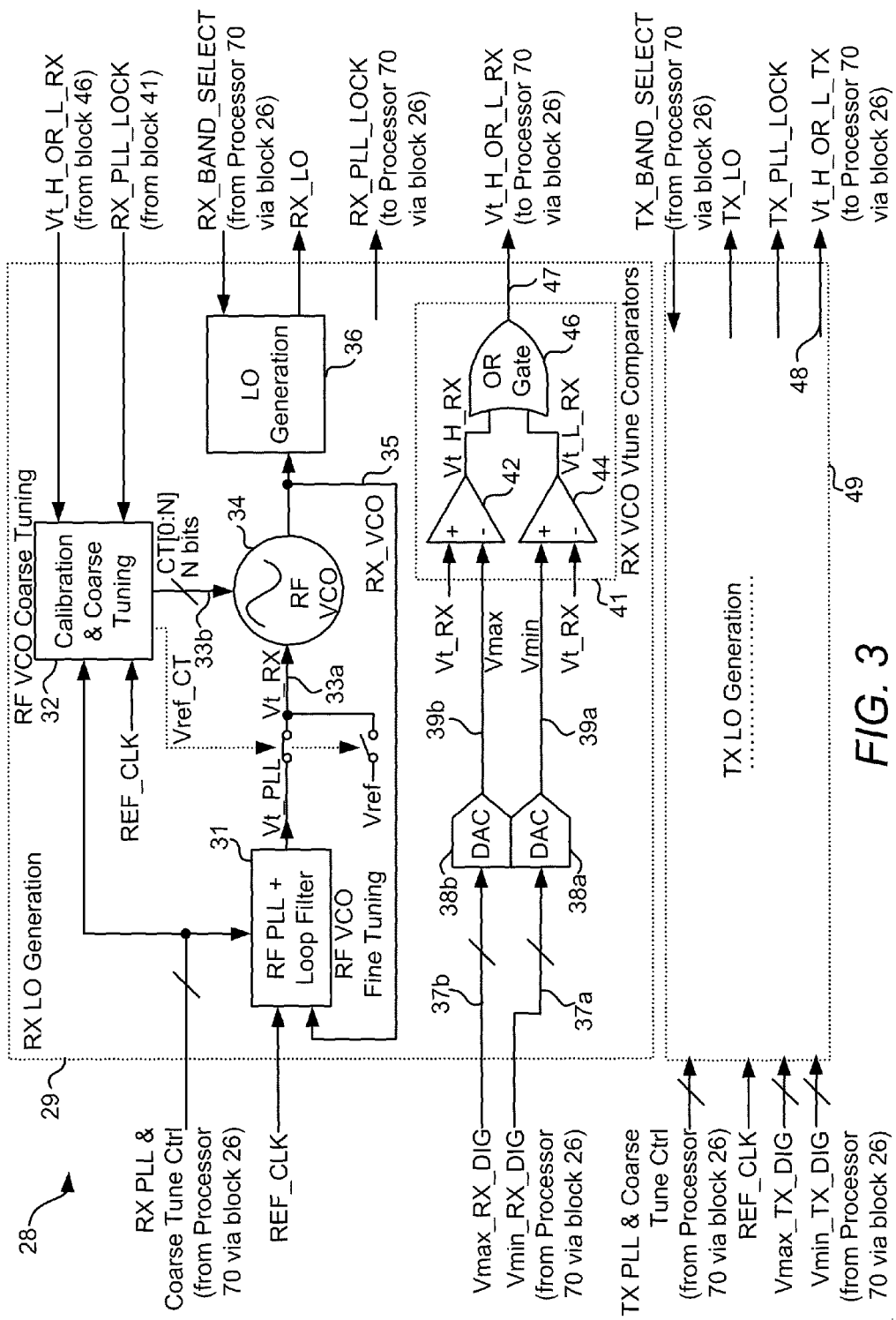
FIG. 3 is a block diagram of a RF local oscillator (RF LO).

FIG. 3 is a diagram of a radio frequency (RF) local oscillator (LO) generation block 28 of FIG. 2 in accordance with the present embodiment as shown. RF LO generation block 28 includes a RX LO generation block 29 and a TX LO generation block 49. RX LO generation block 29 includes a RF VCO fine tuning block (RF PLL) 31 comprising a RF PLL and loop filter. RF PLL 31 compares REF_CLK, from reference clock oscillator 80, to an output signal from RF VCO 34, RX_VCO 35, to lock RF VCO 34 to a desired frequency. RF PLL 31 output, Vt_PLL, is configured as an analog control signal for tuning the frequency of RF VCO 34 with an input signal, Vt_RX 33a.

The output signal from RF VCO 34, RX_VCO 35, is further processed by LO generation block 36. LO generation block 36 converts the RX_VCO 33 signal frequency to a desired receive RF channel frequency, RX_LO. LO generation block 36 may be implemented using frequency dividers, frequency mixers, switches, or a combination of all three types of elements to create a variety of frequency multiplication or division ratios between signals RX_VCO 35 and RX_LO. The RX_LO signal frequency is equal to the desired RX RF channel frequency in a particular operating frequency band (US cellular, US-PCS, IMT, GPS, etc). RX_LO signal is connected to the receive signal processing block 24 of FIG. 2.

A RF VCO coarse tuning circuit 32 is utilized to coarse frequency tune RF VCO 34 at circuit startup and/or during RF channel changes, under processor 70 control, or a hardware state machine (within RF VCO coarse turning circuit 32) control. If there are no starting values for coarse frequency tuning CT[0:N] 33b for a particular RX RF channel frequency, then RF VCO coarse tuning circuit 32 may perform a process called RF VCO calibration for one or more RX RF channel frequencies as will be shown in subsequent FIGS. 10-13.

Two digital to analog converters (DACs 38a and 39b) set Vmax 39b and Vmin 39a tune voltages based on digital inputs Vmax_RX_DIG 37b and Vmin_RX_DIG 37a from processor 70 via block 26 of FIG. 2. Alternative designs may set the analog voltages Vmax 39b and Vmin 39a with other circuit topologies. A Vt_RX comparator circuit 41 compares the Vt_RX 33a input of RF VCO 34 with Vmin 39a and Vmax 39b. If Vt_RX 33a is above Vmax 39b or below Vmin 39a, then an interrupt logic signal Vt_H_OR_L_RX 47 is asserted (either Vt_H_RX OR Vt_L_RX is asserted at the input of OR gate 46). Vt_H_OR_L_RX 47 (active high) initiates RF VCO coarse tuning circuit 32 operation (RF VCO calibration in this instance). Alternatively, the Vt_H_OR_L_RX 47 signal is sent to processor 70 via block 26 of FIG. 9 where processor 70 may control the RF VCO coarse tuning circuit 32 operation (coarse frequency tuning or RF VCO calibration).

An equivalent block for TX LO generation 49 is not shown for brevity. It should be readily understood that a similar block as shown for RX LO generation block 29 may be utilized for TX LO generation block 48 and as many LO generation blocks as required for multiple signal processing blocks of both RX and TX or RX only.

Figure 4:
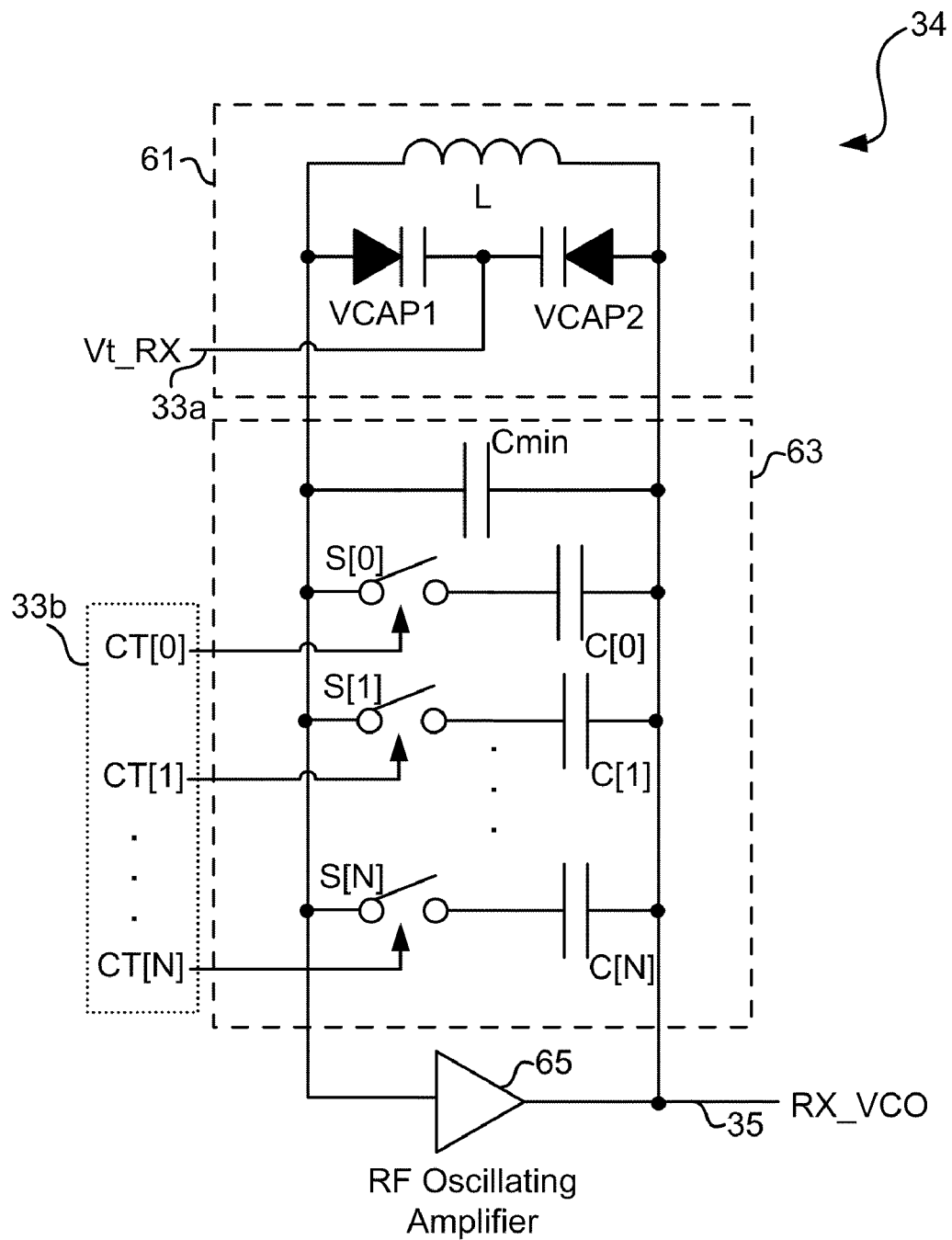
FIG. 4 is a circuit diagram of a RF voltage-controlled oscillator (RF VCO).

FIG. 4 is a circuit diagram of a RF voltage-controlled oscillator (RF VCO 34) of FIG. 3 in accordance with the present embodiment as shown. RF VCO 34 includes fine and coarse capacitive circuit elements to shift RF VCO 34 output frequency. Fine frequency tuning is implemented in LC circuit 61 with an inductor L and two varactors VCAP1 and VCAP2. Frequency (and capacitance) fine tuning of RF VCO 34 is adjusted by analog control voltage, Vt_RX 33a, across VCAP1 and VCAP2. Coarse frequency turning block 63 includes fixed capacitor values Cmin as well as C[0] through C[N]. Other than Cmin, each fixed capacitor (C[0] . . . C[N]) is switched in or out individually or in combination by switches S[0] through S[N] with control signals CT[0] through CT[N] 33b (from block 32 of FIG. 3) to shift RF VCO 34 output frequency in coarse frequency steps (RX_VCO 35).

The RF VCO 34 circuit is created when the frequency resonant structure composed of circuits 61 and 63 is placed in feedback around RF oscillating amplifier 65 (across the input and output of RF oscillator amplifier 65). The output frequency (in radians/sec) of RF VCO 34 is equal to $\sqrt{(1/(L*Cvco))}$, where Cvco is a combination of fine and active coarse frequency tuning elements such that Cvco=Cmin+the active coarse capacitive circuit elements (C[0] . . . C[N])+ Cvcap, where Cvcap is the total capacitance of VCAP1 and VCAP2 within LC circuit 61. The output, RX_VCO 35, of RF VCO 34, is then fed back as an input to RF PLL 31 and to LO generation block 36, as shown in FIG. 3.

The same circuit could apply across as many RF VCOs as required for multiple paths of both RX and TX or RX only (GPS or receiving broadcast signals). Alternatively one RF VCO may cover multiple modes and operating bands as long as simultaneous operation is not required. Other circuit topologies of distributed switchable frequency resonant elements (capacitors, inductors, transistors or combinations thereof) can discretely shift RF VCO output frequency, but are functionally equivalent.

Figure 5:
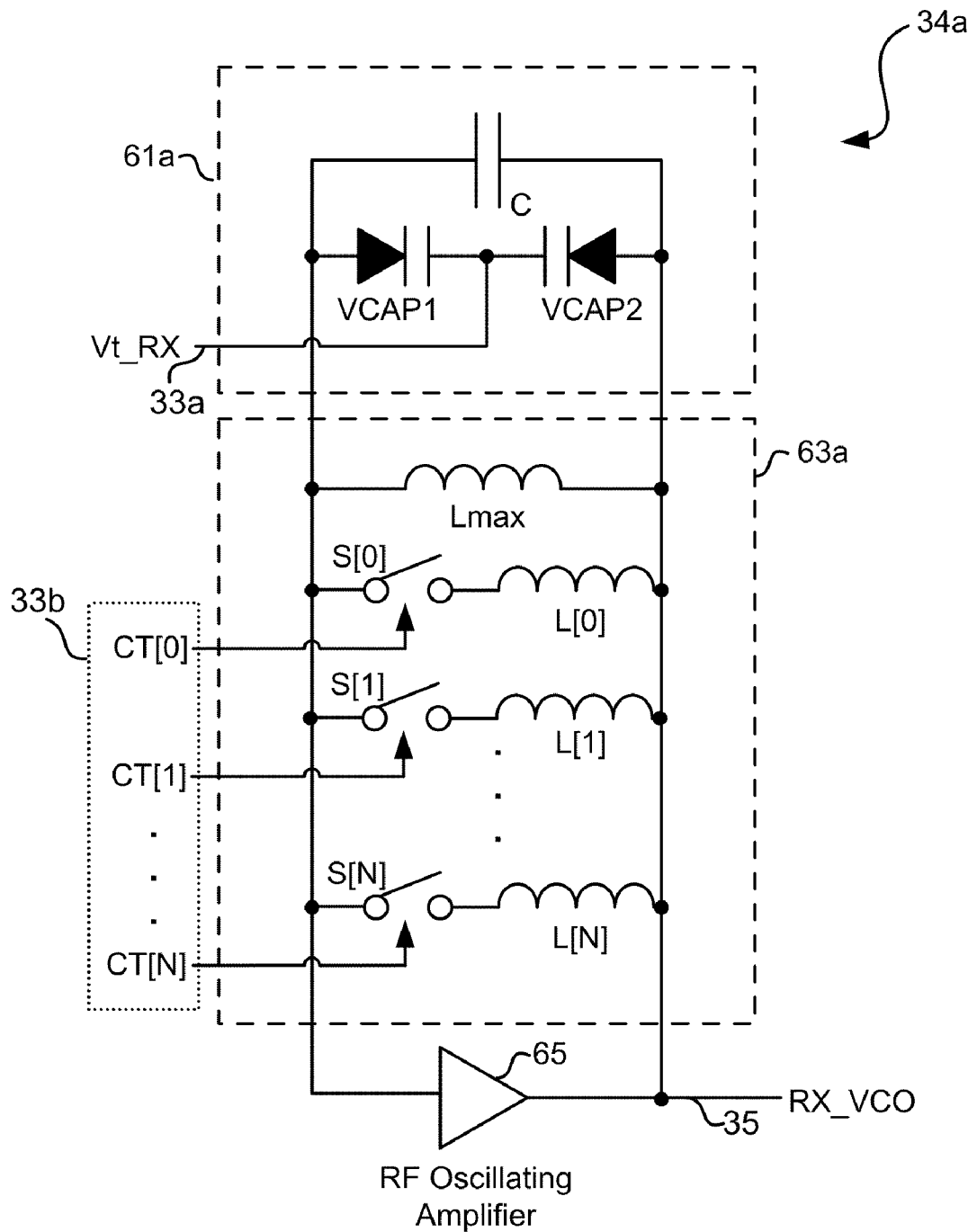
FIG. 5 is a circuit diagram of an alternate RF VCO.

FIG. 5 is a circuit diagram of an alternate RF VCO 34a of FIG. 3 in accordance with the present embodiment as shown. RF VCO 34a includes fine capacitive and coarse inductive circuit elements to shift RF VCO 34a output frequency (RX_VCO 35). Fine frequency tuning is implemented in capacitive circuit 61a with a capacitor C and two varactors VCAP1 and VCAP2. Frequency (and capacitance) fine tuning of RF VCO 34a is adjusted by analog control voltage, Vt_RX 33a, across VCAP1 and VCAP2. Coarse frequency turning block 63a includes fixed inductor values Lmax as well as switched fixed inductor values L[0] through L[N]. Other than Lmax, each fixed inductor (L[0] ... L[N]) is switched in or out individually or in combination by switches S[0] through S[N] with control signals CT[0] through CT[N] 33b (from block 32 of FIG. 3) to shift RF VCO 34a output frequency in coarse frequency steps (RX_VCO 35).

The RF VCO 34a is created when the frequency resonant structure composed of circuits 61a and 63a is placed in feedback around RF oscillating amplifier 65 (across the input and output of RF oscillator amplifier 65). The output frequency (in radians/sec) of RF VCO 34 is equal to $\sqrt{(1/(Lvco*Cvco))}$, where Cvco is a combination of fine frequency tuning elements such that Cvco=C+Cvcap, where Cvcap is the total capacitance of VCAP1 and VCAP2 within capacitive circuit 61a and where Lvco is the parallel combination of Lmax and active coarse frequency tuning elements (L[0] ... L[N]). The output, RX_VCO 35, of RF VCO 34a, is then fed back as an input to RF PLL 31 and into LO generation block 36, as shown in FIG. 3.

The same circuit could apply across as many RF VCOs as required for multiple paths of both RX and TX or RX only (GPS or receiving broadcast signals). Alternatively one RF VCO may cover multiple modes and operating bands as long as simultaneous operation is not required. Other circuit topologies of distributed switchable frequency resonant elements (capacitors, inductors, transistors or combinations thereof) can discretely shift RF VCO output frequency, but are functionally equivalent.

Figure 6:
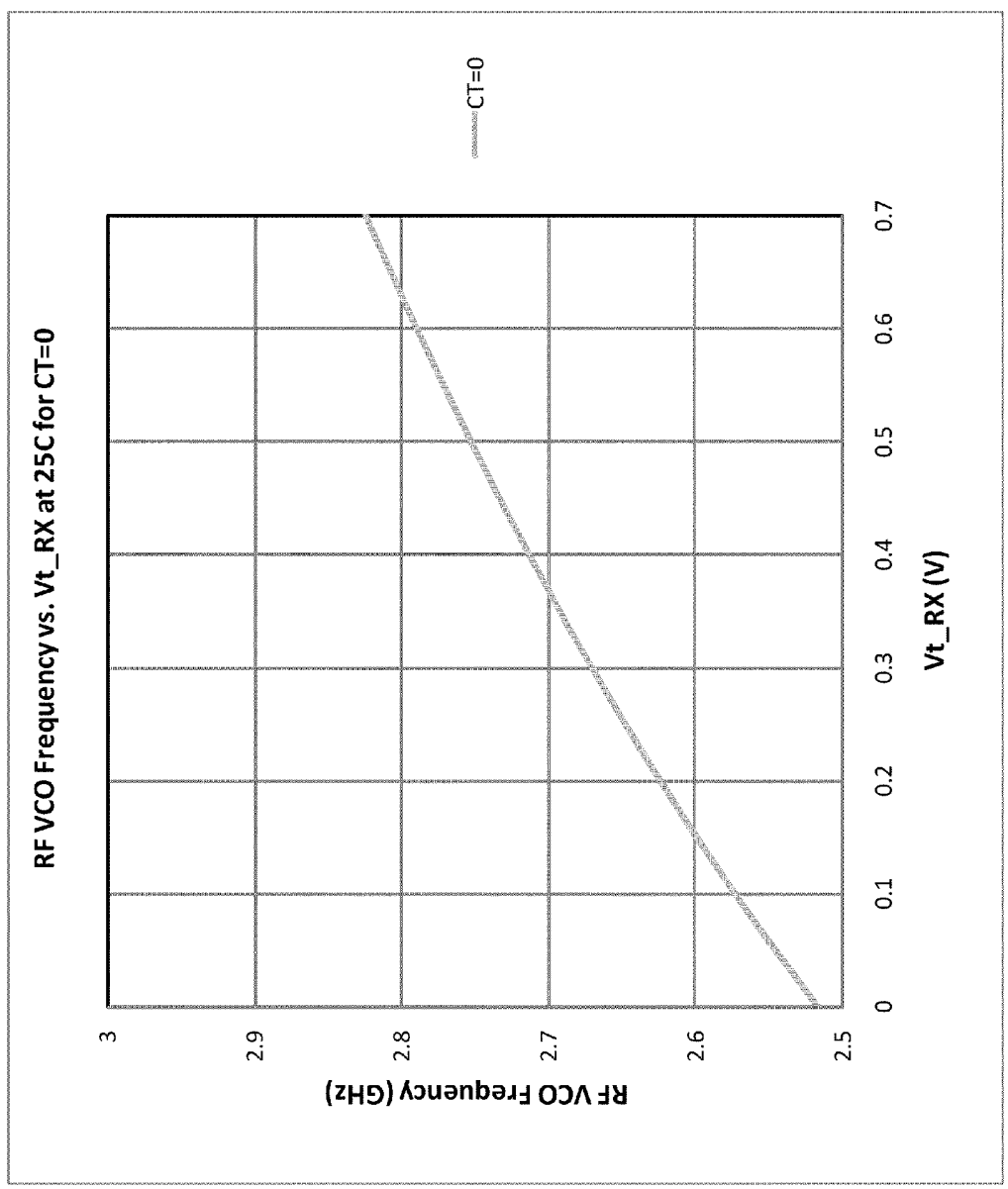
FIG. 6 is a graph of RF VCO fine frequency output vs. tuning voltage (Vt_RX).

FIG. 6 is a graph of RF VCO 34 fine frequency output vs. tuning voltage (Vt_RX 33a) of FIG. 3 in accordance with the present embodiment as shown. The graph includes RF VCO 34 output frequency verses a fine frequency tuning voltage, Vt_RX 33a, for a fixed coarse tuning code 33b, CT=0, and at 25 degrees C. operating temperature. CT=0 corresponds to all the switch elements in the coarse tuning circuit 63 open. In this instance, the tuning range of RF VCO 34 is controlled by fine frequency tuning voltage, Vt_RX 33a, between 0 and 0.7 volts DC. The equivalent circuit may be applied to different RX or TX frequency ranges by shifting the inductor or capacitor element values within RF VCO 34.

Figure 7:
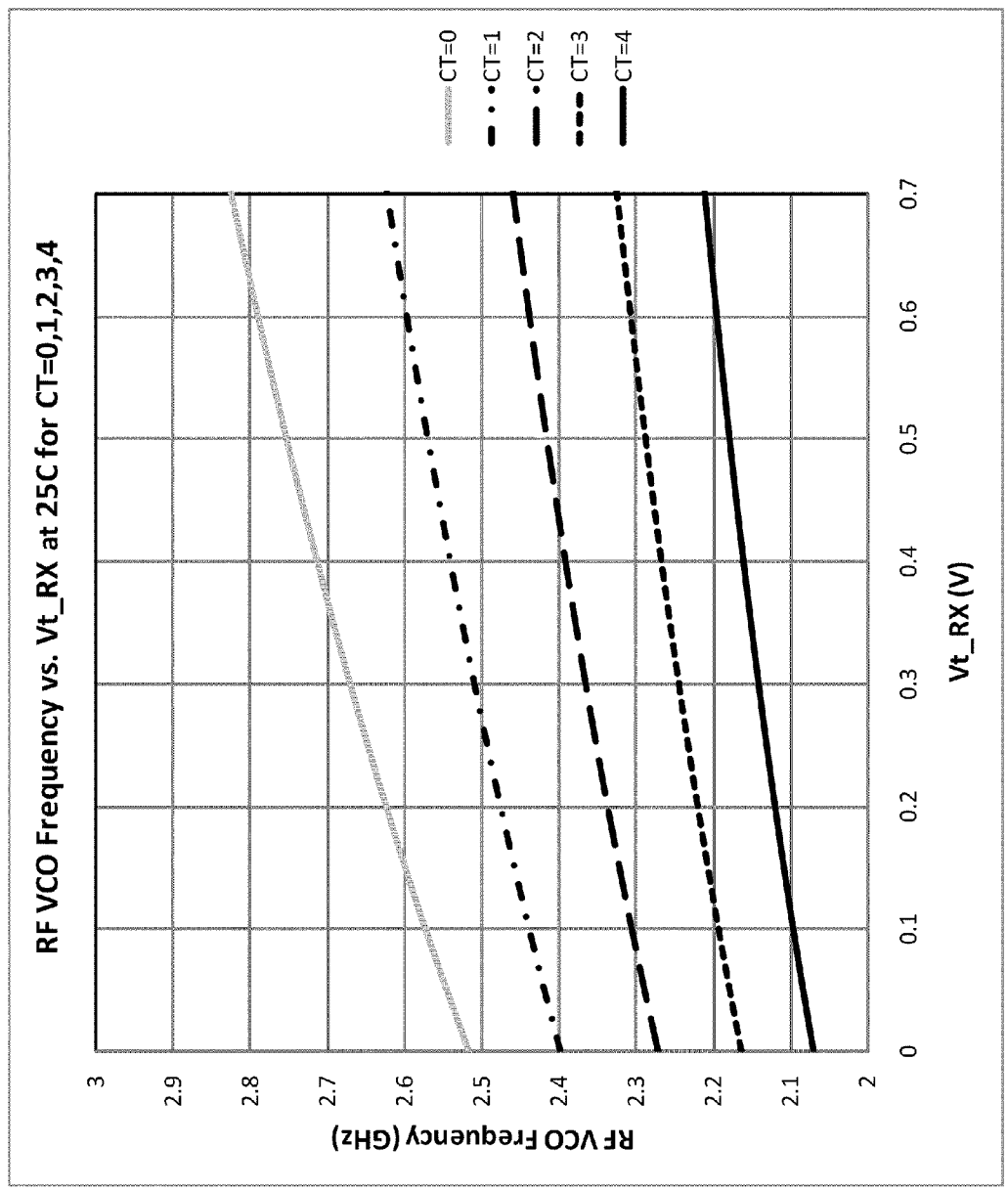
FIG. 7 is a graph of RF VCO coarse and fine frequency output vs. tuning voltage (Vt_RX) and coarse tuning code (CT).

FIG. 7 is a graph of RF VCO 34 coarse and fine frequency output vs. tuning voltage (Vt_RX 33a) and coarse tuning code 33b (CT) of FIG. 3 in accordance with the present embodiment as shown. The graph includes RF VCO 34 output frequency output frequency verses the fine frequency tuning voltage, Vt_RX 33a, for multiple coarse tuning codes 33b, CT=0, 1, 2, 3, 4, and at 25 degrees C. operating temperature. The coarse frequency tuning codes 33b correspond to incrementing the least-significant bits (LSBs) of CT[0:N] from 0 to 4 and opening and closing the corresponding switch elements in the coarse frequency tuning circuit 63. The fine frequency tuning range of RF VCO 34 is controlled by fine frequency tuning in each instance of CT (0 to 4), Vt_RX 33a, between 0 and 0.7 volts DC. With both coarse and fine frequency tuning, the total frequency tuning range of RF VCO 34 is greater than previously shown in FIG. 6 where only fine frequency tuning was utilized. The equivalent circuit may be applied to different RX or TX frequency ranges by shifting the center frequency of the LC circuit composed of elements 61 and 63 of RF VCO 34 using the switched elements or a design change in the total capacitance or inductance or both.

Figure 8:
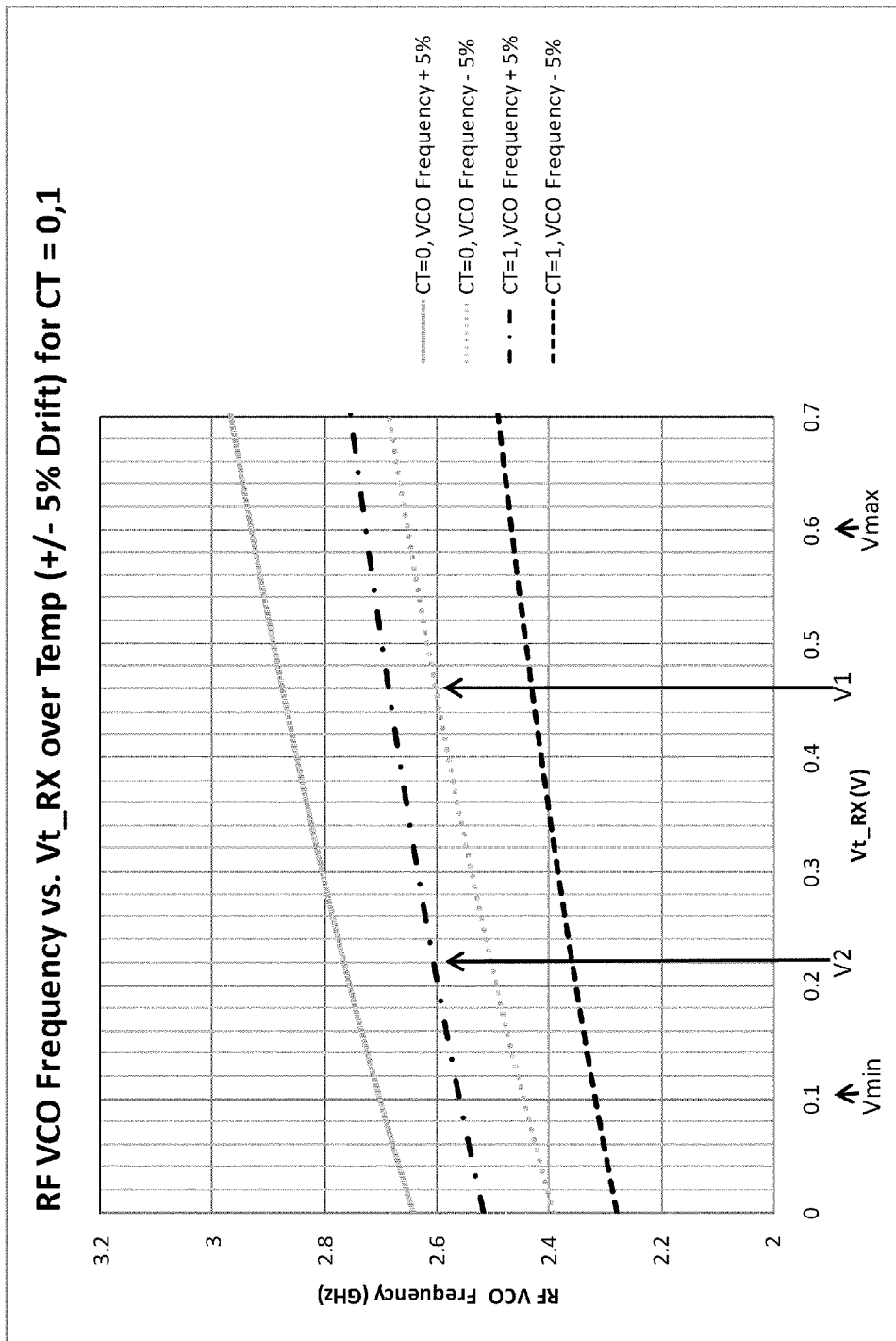
FIG. 8 is a graph of RF VCO coarse and fine frequency output vs. tuning voltage (Vt_RX), coarse tuning code (CT), and temperature drift.

FIG. 8 is a graph of RF VCO 34 coarse and fine frequency output vs. tuning voltage (Vt_RX 33a), coarse tuning code 33b (CT), and temperature drift of FIG. 3 in accordance with the present embodiment as shown. The graph includes RF VCO 34 output frequency verses the fine frequency tuning voltage, Vt_RX 33a, for two coarse tuning codes 33b, CT=0 and 1, and over the RF VCO 34 full operating temperature range. In this instance, the operating temperature range shifts the output frequency of RF VCO 34 by ±5% relative to 25 degrees C. The tuning range of RF VCO 34 is controlled by fine tuning in each instance of CT (CT=0 and 1), Vt_RX 33a, between 0 and 0.7 volts DC. If the desired output frequency is 2.6 GHz, the CT value must change from 0 to 1 for Vmin (0.1V)<Vt_RX<Vmax (0.6V) to remain valid over the operating temperature range. If the starting value of CT is 0 with a tuning voltage of V1 (0.22V) and the temperature shift is from −5 to +5%, the RF VCO 34 will not maintain frequency lock until CT is changed from 0 to 1. At the point that CT is changed to 1, the new tuning voltage is V2 (0.46V, within specified limits of Vmin and Vmax). The equivalent circuit may be applied to different RX or TX frequency ranges by starting with a different tuning frequency range for Vt_RX 33a and coarse tuning codes 33b. Performing the RF VCO calibration process with RF VCO coarse tuning circuit 32 will change the coarse tuning code (CT) from 0 to 1 in this instance.

Figure 9:
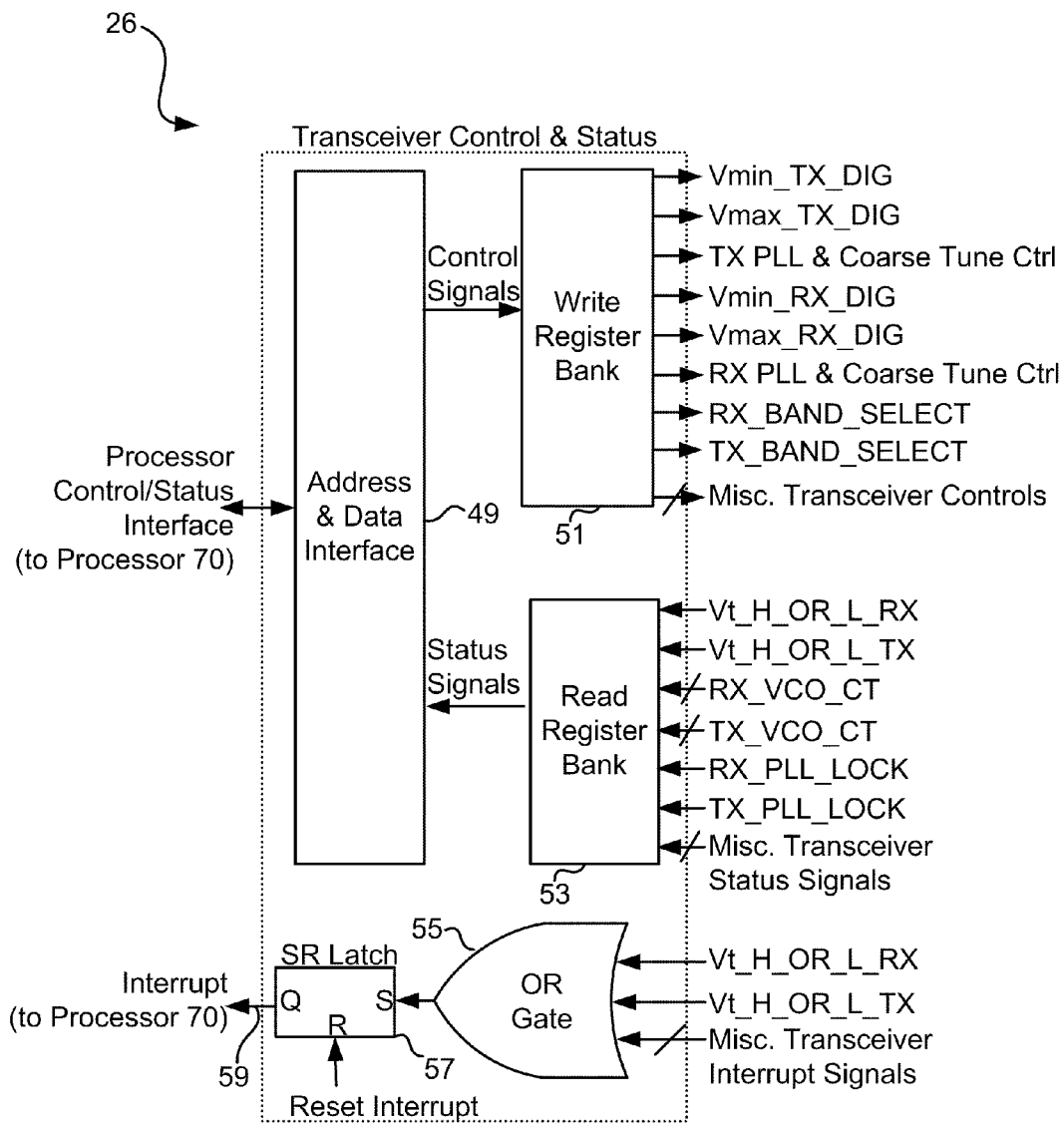
FIG. 9 is a block diagram of a transceiver control & status circuit.

FIG. 9 is a block diagram of a transceiver control & status circuit 26 of FIG. 2 in accordance with the present embodiment as shown. Transceiver control and status circuit 26 includes an interface 49 to processor 70 (of FIG. 1) for addressing and data encoding/decoding, a write register bank 51, a read register bank 53, and a OR gate 55 for combining multiple transceiver interrupt signals into one interrupt signal 59. Transceiver control and status circuit 26 also includes a set-reset (SR) latch 57 which is set if triggered by OR gate 55. The SR latch 57 is cleared (reset) by processor 70 prior to initiating RF VCO 34 calibration or in response to any interrupt generated by transceiver 20 by other circuits (not shown).

Figure 10:
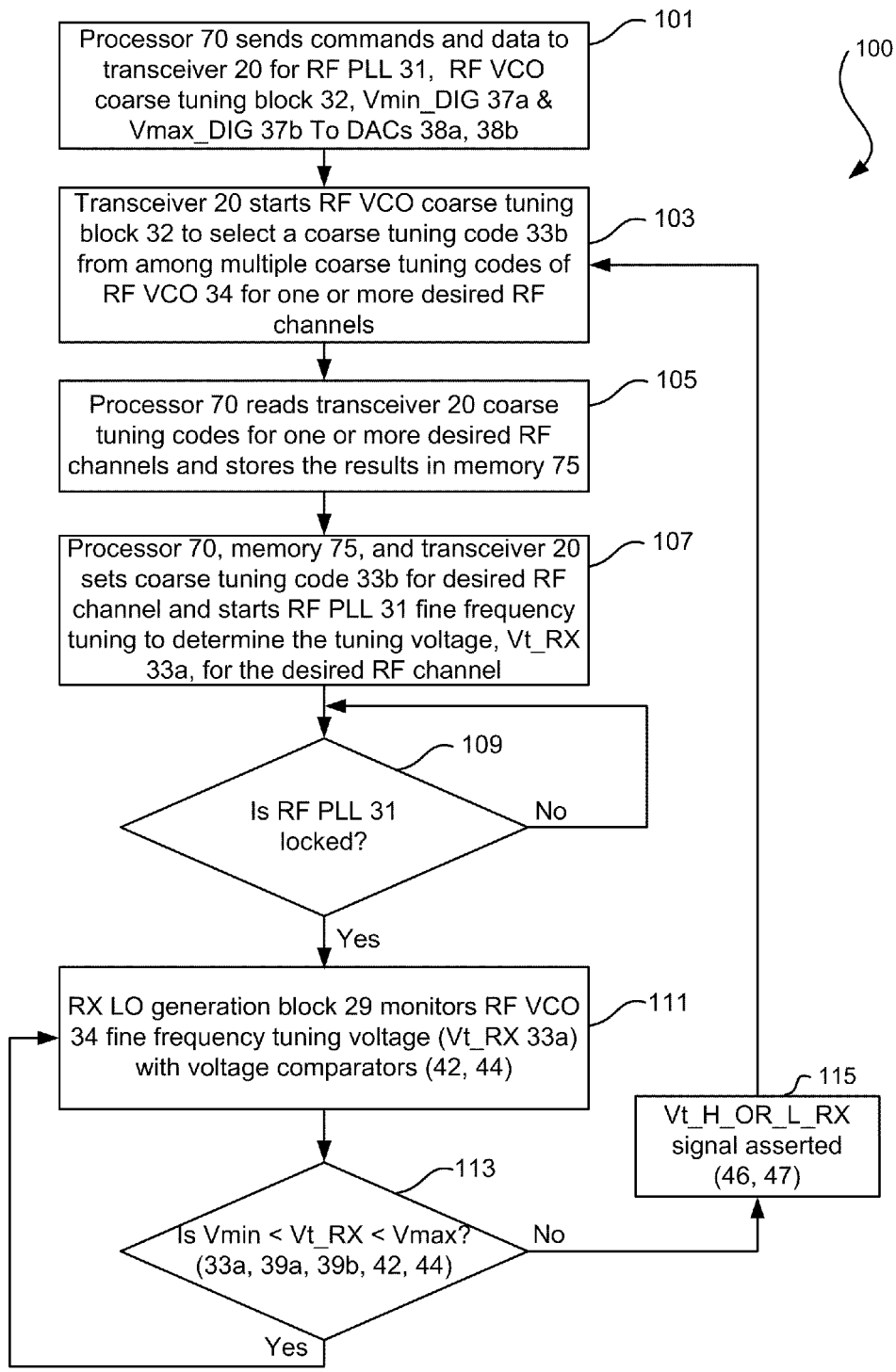
FIG. 10 is an operational flow diagram of the process for performing fine frequency tuning of a RF VCO, monitoring the fine frequency tuning signal voltage (Vt_RX), and coarse frequency tuning code (CT) during calibration under hardware control.

FIG. 10 is an operational flow diagram of the process for performing fine frequency tuning of a RF VCO 34, monitoring the fine frequency tuning signal voltage (Vt_RX 33a), and coarse frequency tuning code 33b (CT) during calibration under hardware control of FIGS. 1, 2, 3, 8 and 9 in accordance with a preferred embodiment.

Operation flow diagram 100 starts when processor 70 sends commands and data to transceiver 20 for RF PLL 31, RF VCO coarse tuning block 32, and Vmin_DIG 37a and Vmax_DIG 37b to DACs 38a and 38b (block 101). Transceiver 20 starts RF VCO coarse tuning block 32 to select a coarse tuning code 33b from among multiple coarse tuning codes of RF VCO 34 for one or more desired RF channels (block 103). Processor 70 reads transceiver 20 coarse tuning codes for one or more desired RF channels and stores the results in memory 75 (RF VCO 34 calibration completed and coarse tuning codes stored) (block 105). Processor 70, memory 75, and transceiver 20 sets coarse tuning code 33b for desired RF channel and starts RF PLL 31 fine frequency tuning to determine the tuning voltage, Vt_RX 33a, for the desired RF channel (block 107). After the RF PLL 31 has locked on the desired RF channel (block 109), RX LO generation block 29 monitors RF VCO 34 fine frequency tuning voltage, Vt_RX 33a, with voltage comparators (42, 44) (block 111). If the voltage comparators (42 and 44) detect the condition where Vt_RX 33a is outside of either Vmin 39a or Vmax 39b (block 113), Vt_H_OR_L_RX signal is asserted (OR gate 46 and signal 47) (block 115 restarts process 100 at block 103). At any time, the operation flow diagram 100 may restart if the current RF channel is changed (back to block 101).

Figure 11:
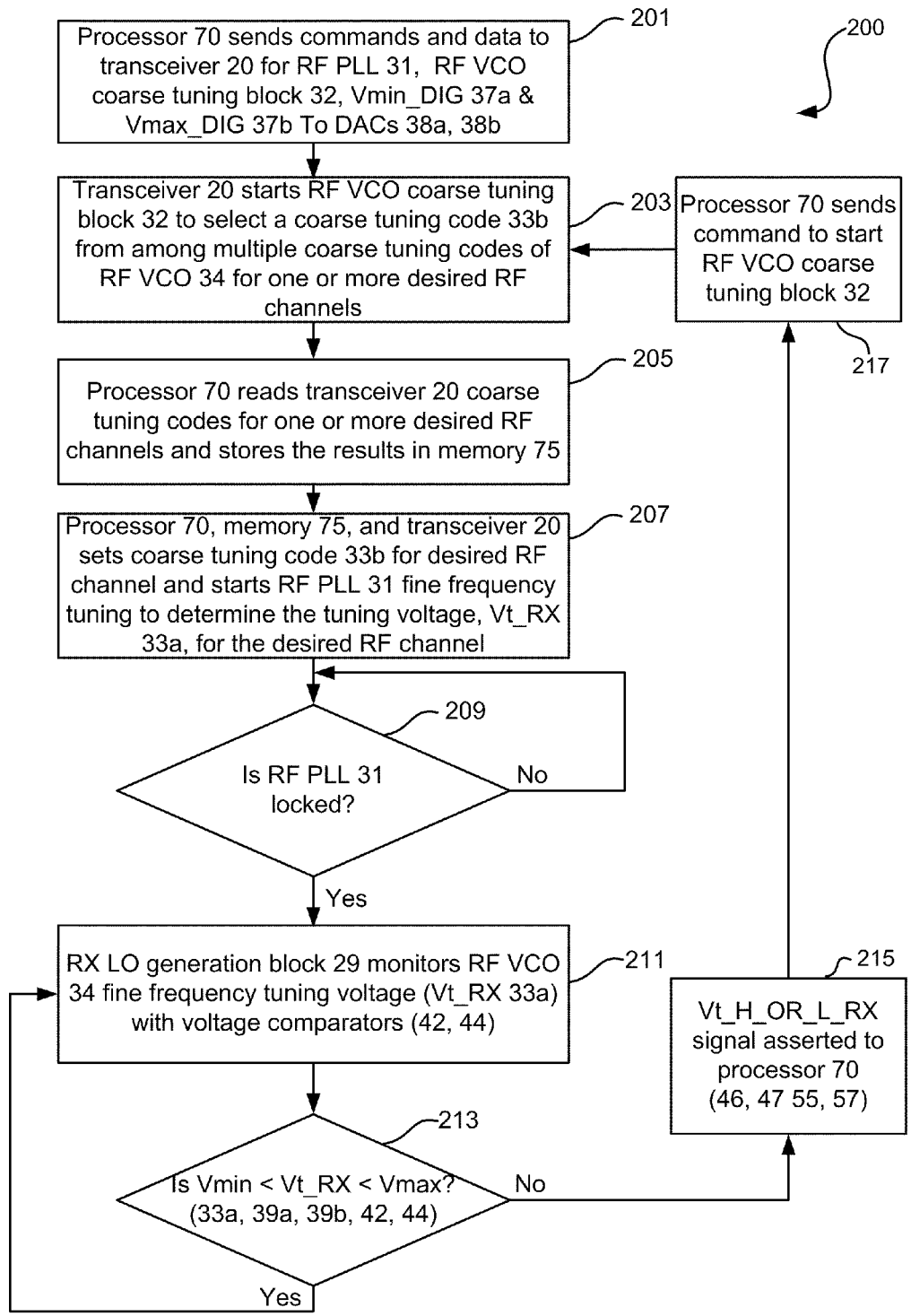
FIG. 11 is an operational flow diagram of the process for performing fine frequency tuning of a RF VCO, monitoring the fine frequency tuning signal voltage (Vt_RX), and coarse frequency tuning code (CT) during calibration under processor control.

FIG. 11 is an operational flow diagram of the process for performing fine frequency tuning of a RF VCO 34, monitoring the fine frequency tuning signal voltage (Vt_RX 33a), and coarse frequency tuning code 33b (CT) during calibration under processor control of FIGS. 1, 2, 3, 8 and 9 in accordance with a preferred embodiment.

Operation flow diagram 200 starts when processor 70 sends commands and data to transceiver 20 for RF PLL 31, RF VCO coarse tuning block 32, and Vmin_DIG 37a and Vmax_DIG 37b to DACs 38a and 38b (block 201). Transceiver 20 starts RF VCO coarse tuning block 32 to select a coarse tuning code 33b from among multiple coarse tuning codes of RF VCO 34 for one or more desired RF channels (block 203). Processor 70 reads transceiver 20 coarse tuning codes for one or more desired RF channels and stores the results in memory 75 (RF VCO 34 calibration completed and coarse tuning codes stored) (block 205). Processor 70, memory 75, and transceiver 20 sets coarse tuning code 33b for desired RF channel and starts RF PLL 31 fine frequency tuning to determine the tuning voltage, Vt_RX 33a, for the desired RF channel (block 207). After the RF PLL 31 has locked on the desired RF channel (block 209), RX LO generation block 29 monitors RF VCO 34 fine frequency tuning voltage, Vt_RX 33a, with voltage comparators (42, 44) (block 211). If the voltage comparators (42 and 44) detect the condition where Vt_RX 33a is outside of either Vmin 39a or Vmax 39b (block 213), interrupt asserted (46, 47, 55, 57) to processor 70 (block 215). Processor 70 sends command to start RF VCO coarse tuning block 32 (block 217 restarts process 200 at block 203). At any time, the operation flow diagram 200 may restart if the current RF channel is changed (back to block 201).

Figure 12:
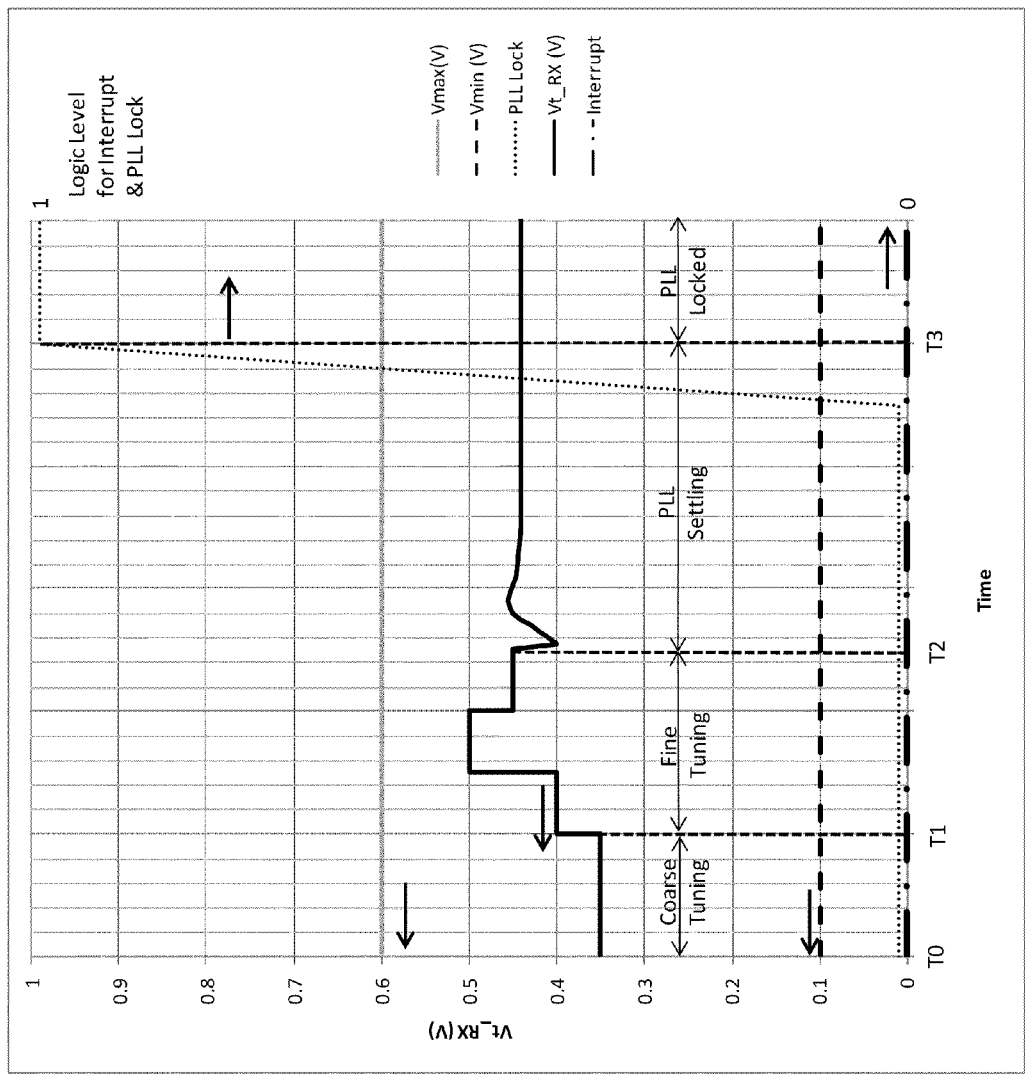
FIG. 12 is a plot of RF VCO fine frequency tuning signal voltage (Vt_RX) during an initial RF PLL locking procedure.

FIG. 12 is a plot of RF VCO 34 fine frequency tuning signal voltage (Vt_RX 33a) during an initial RF PLL 31 locking procedure of FIG. 3 in accordance with the present embodiment as shown. The plot is an example timeline of startup behavior for several relevant signals for the RX LO generation block 29 and includes RF VCO 34 fine tuning input, Vt_RX 33a, RF PLL 31 lock signal (RX_PLL_LOCK), and the corresponding generated interrupt signal (Vt_H_OR_L_RX 47) from OR gate 46 during initial coarse frequency tuning, fine frequency tuning, RF PLL 31 settling (Vt_PLL), and RF PLL 31 locked conditions. Assuming all the circuit block supply voltages and RF PLL 31 settings have been preset to the desired RF channel (Time=0), RF VCO coarse tuning circuit 32 starts. During RF VCO 34 coarse frequency calibration (between Time=0 and Time<T1), the tuning voltage from RF PLL 31, Vt_PLL, is disconnected (utilizing Vref_CT control signal from RF VCO coarse tuning block 32) from RF VCO 34 fine frequency tuning input (Vt_RX 33a). During calibration, reference voltage (Vref) is connected (Vt_RX 33a=Vref during coarse frequency calibration) to RF VCO 34 fine frequency tuning input. Vref is equal to (Vmax+Vmin)/2 in this example, but other voltage settings may be used. RF VCO 34 calibration process with RF PLL 31 and RF VCO coarse tuning circuit 32 is described in further detail below in accordance with the present embodiment as shown.

Within RF VCO coarse tuning circuit 32, all CT[0:N] bits (coarse tuning code 33b bits most significant bit, MSB, to least significant bit, LSB) are toggled successively until RF VCO 34 converges to the frequency setting closest to the desired RF channel frequency. After RF VCO coarse frequency calibration is completed (coarse tuning code 33b MSB through LSB set optimally by Time=T1) by RF VCO coarse tuning circuit 32, fine frequency tuning voltage from RF PLL 31, Vt_PLL, is reconnected to RF VCO 34 input tune line (Vt_RX 33a=Vt_PLL) and fine frequency tuning correction is completed (by Time=T2). From this point in time, RF PLL 31 output voltage Vt_PLL, and RF VCO 34 converge (RX_PLL_LOCK indicates lock condition) to the desired frequency within a short time interval (by Time=T3). Subsequent to RF PLL 31 indicating lock condition (Time>T3), the fine frequency tuning voltage, Vt_RX 33a, is monitored for voltage compliance between Vmin 39a and Vmax 39b values.

Figure 13:
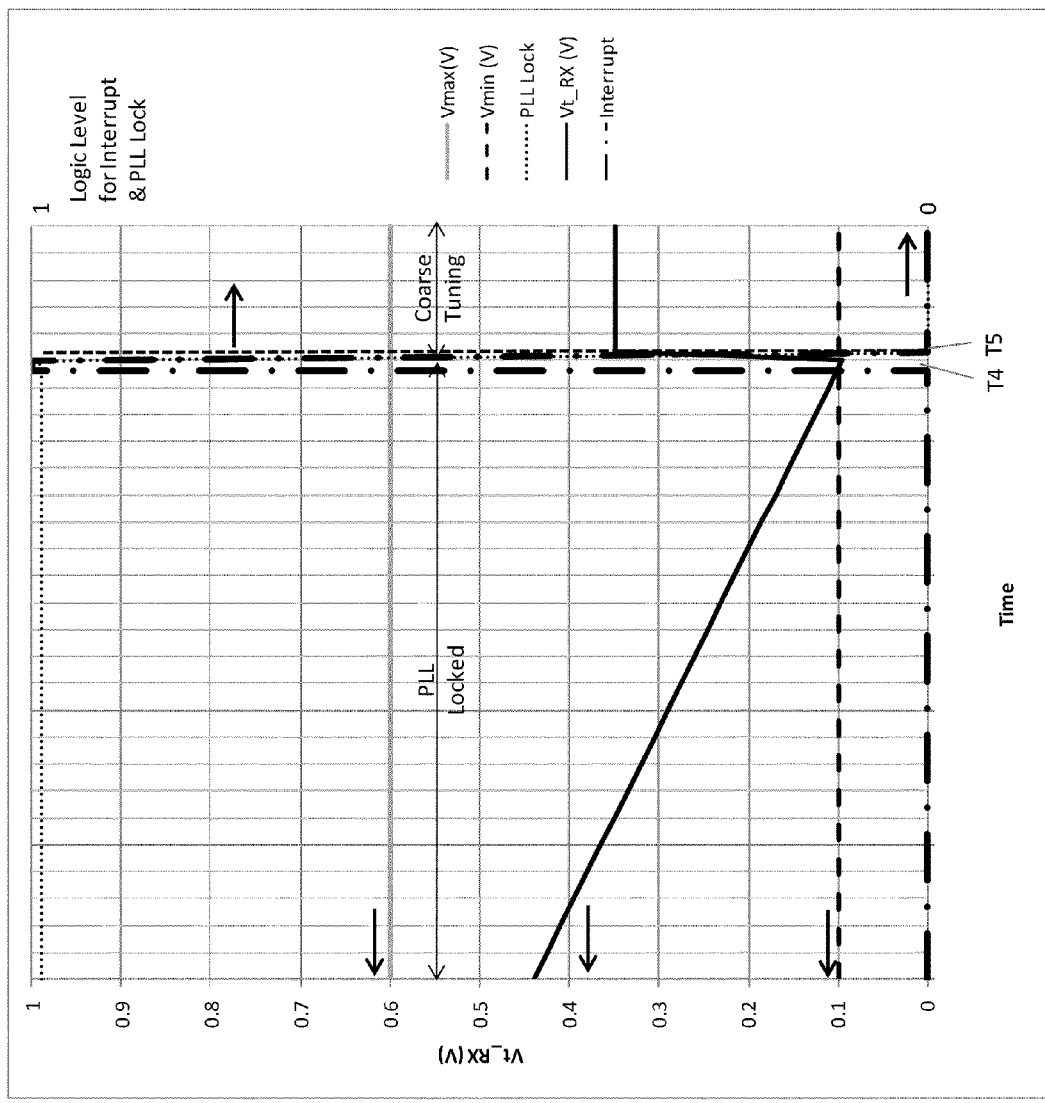
FIG. 13 is a plot of RF VCO fine frequency tuning signal voltage (Vt_RX), and RF PLL lock signal, while monitoring the corresponding interrupt signal before, during and after coarse frequency calibration.

FIG. 13 is a plot of RF VCO 34 fine frequency tuning signal voltage (Vt_RX 33a), and RF PLL lock signal, while monitoring the corresponding interrupt signal 47 before, during and after coarse frequency calibration of FIG. 3 in accordance with the present embodiment as shown. The plot is an example timeline of RF VCO 34, Vt_RX 33a, RF PLL 31 lock (RX_PLL_LOCK signal), and RF VCO 34, Vt_RX 33a, generated interrupt signal 47 (at the output of OR gate 46) when Vt_RX 33a falls below Vmin 39a. In this example, the interrupt signal is asserted (Time=T4) and RF VCO coarse tuning circuit 32 is restarted (Time=T5). The prior figure shows what happens after RF VCO coarse tuning circuit 32 has completed calibration (Time=T1 in FIG. 12).

Those of skill in the art would understand that signals may be represented using any of a variety of different techniques. For example, data, instructions, signals that may be referenced throughout the above description may be represented by voltages, currents, electromagnetic waves, magnetic fields or particles, or any combination thereof.

Those of skill would further appreciate that the various illustrative radio frequency or analog circuit blocks described in connection with the disclosure herein may be implemented in a variety of different circuit topologies, on one or more integrated circuits, separate from or in combination with logic circuits and systems while performing the same functions described in the present disclosure.

Those of skill would further appreciate that the various illustrative logical blocks, modules, circuits, and algorithm steps described in connection with the disclosure herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present disclosure.

The various illustrative logical blocks, modules, and circuits described in connection with the disclosure herein may be implemented or performed with a general-purpose processor, a digital signal processor (DSP), an application specific integrated circuit (ASIC), a field programmable gate array (FPGA) or other programmable logic device, discrete gate or transistor logic, discrete hardware components, or any combination thereof designed to perform the functions described herein. A general-purpose processor may be a microprocessor, but in the alternative, the processor may be any conventional processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration.

The steps of a method or algorithm described in connection with the disclosure herein may be embodied directly in hardware, in a software module executed by a processor, or in a combination of the two. A software module may reside in RAM memory, flash memory, ROM memory, EPROM memory, EEPROM memory, registers, hard disk, a removable disk, a CD-ROM, or any other form of storage medium known in the art. An exemplary storage medium is coupled to the processor such that the processor can read information from, and write information to, the storage medium. In the alternative, the storage medium may be integral to the processor. The processor and the storage medium may reside in an ASIC. The ASIC may reside in a user terminal. In the alternative, the processor and the storage medium may reside as discrete components in a user terminal.

The previous description of the disclosure is provided to enable any person skilled in the art to make or use the disclosure. Various modifications to the disclosure will be readily apparent to those skilled in the art, and the generic principles defined herein may be applied to other variations without departing from the scope of the disclosure. Thus, the disclosure is not intended to be limited to the examples and designs described herein but are to be accorded the widest scope consistent with the principles and novel features disclosed herein.

What is claimed is:

1. A device comprising:
   a memory;
   a transceiver; and
   a processor coupled to the memory and the transceiver,
   wherein the transceiver comprises:
      a radio frequency voltage controlled oscillator (RF VCO) with coarse frequency tuning and fine frequency tuning;
      a fine frequency tuning circuit with a continuous analog control voltage configured to adjust the RF VCO in small frequency steps;
      a coarse frequency tuning circuit configured to receive a reference clock signal, a phase locked loop signal, and an output interrupt signal, and further configured to select a coarse tuning code from among a plurality of coarse tuning codes and transmit the selected tuning code to the processor, wherein receipt of the output interrupt signal causes the coarse frequency tuning circuit to adjust the RF VCO frequency in large frequency steps;
      digital-to-analog converters configured to generate analog voltage thresholds Vmin and Vmax based on digital inputs;
      a comparator circuit, coupled to an analog control voltage input of the RF VCO and to the digital-to-analog converters and configured to compare the analog control voltage input of the RF VCO with Vmin and Vmax; and
      a comparator circuit configured to generate the output interrupt signal to initiate RF VCO coarse frequency calibration when the fine frequency tuning circuit voltage input to the RF VCO is either above Vmax or below Vmin,
   wherein the processor is configured to:
      receive the generated interrupt signal;
      generate a command signal to initiate coarse tuning upon receipt of the interrupt signal;
      transmit the command signal to the transceiver to initiate coarse tuning;
      receive the selected coarse tuning code from the transceiver; and
      store the selected coarse tuning code in the memory.

2. A method comprising:
   receiving a command signal from a processor to initiate coarse tuning;
   selecting a coarse tuning code from among a plurality of coarse tuning codes;
   transmitting the selected coarse tuning code to the processor;
   storing the selected coarse tuning code in memory;
   obtaining a fine frequency tuning value of a radio frequency voltage controlled oscillator (RF VCO) with coarse frequency tuning and fine frequency tuning;
   generating analog voltage minimum and maximum thresholds, Vmin and Vmax, based on digital inputs;
   comparing the fine frequency tuning value with the voltage minimum and maximum thresholds;
   asserting an interrupt signal to the processor when the fine frequency tuning value is less than the minimum threshold value or greater than the maximum threshold value; and
   transmitting a signal from the processor to a coarse tuning block to perform coarse frequency calibration of the RF VCO in response to the asserted interrupt.

3. A non-transitory, tangible computer-readable medium having stored thereon instructions configured to cause a processor to perform operations:
   receiving a command signal from a processor to initiate coarse tuning;
   selecting a coarse tuning code from among a plurality of coarse tuning codes;
   transmitting the selected coarse tuning code to the processor;
   storing the selected coarse tuning code in memory;
   obtaining a fine frequency tuning value of a radio frequency voltage controlled oscillator (RF VCO) with coarse frequency tuning and fine frequency tuning;
   generating analog voltage minimum and maximum thresholds, Vmin and Vmax, based on digital inputs;
   comparing the fine frequency tuning value with the voltage minimum and maximum thresholds;
   asserting an interrupt signal to the processor when the fine frequency tuning value is less than the minimum threshold value or greater than the maximum threshold value; and
   transmitting a signal from the processor to a coarse tuning block to perform coarse frequency calibration of the RF VCO in response to the asserted interrupt.

4. A device comprising:
   means for receiving a command signal from a processor to initiate coarse tuning;
   selecting a coarse tuning code from among a plurality of coarse tuning codes;
   transmitting the selected coarse tuning code to the processor;

storing the selected coarse tuning code in memory;

means for obtaining a fine frequency tuning value of a radio frequency voltage controlled oscillator (RF VCO) with coarse frequency tuning and fine frequency tuning;

means for generating analog voltage minimum and maximum thresholds, Vmin and Vmax, based on digital inputs;

means for comparing the fine frequency tuning value with the voltage minimum and maximum thresholds;

means for asserting an interrupt signal to the processor when the fine frequency tuning value is less than the minimum threshold value or greater than the maximum threshold value; and means for transmitting a signal from the processor to a coarse tuning block to perform coarse frequency calibration of the RF VCO in response to the asserted interrupt.

* * * * *